United States Patent
Fjelstad et al.

(10) Patent No.: US 8,324,727 B2
(45) Date of Patent: Dec. 4, 2012

(54) LOW PROFILE DISCRETE ELECTRONIC COMPONENTS AND APPLICATIONS OF SAME

(75) Inventors: Joseph C. Fjelstad, Maple Valley, WA (US); Kevin P. Grundy, Fremont, CA (US); Para K. Segaram, Cupertino, CA (US); William F. Wiedemann, Campbell, CA (US); Thomas J. Obenhuber, San Francisco, CA (US); Inessa Obenhuber, legal representative, San Francisco, CA (US)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 12/720,110

(22) Filed: Mar. 9, 2010

(65) Prior Publication Data

US 2010/0165525 A1 Jul. 1, 2010

Related U.S. Application Data

(62) Division of application No. 10/857,830, filed on Jun. 1, 2004, now Pat. No. 7,701,323.

(60) Provisional application No. 60/474,442, filed on May 30, 2003.

(51) Int. Cl.
H01L 23/34 (2006.01)

(52) U.S. Cl. ........ 257/723; 257/703; 257/678; 257/784; 338/309

(58) Field of Classification Search .................. 257/703, 257/784, 678, 723; 338/309
See application file for complete search history.

(56) References Cited

U.S. PATENT DOCUMENTS

| | | | |
|---|---|---|---|
| 3,808,576 A | 4/1974 | Castonguay et al. | |
| 4,387,137 A | 6/1983 | Rice | |
| 5,010,641 A * | 4/1991 | Sisler | 29/830 |
| 5,030,800 A * | 7/1991 | Kawakami et al. | 174/264 |
| 5,079,069 A | 1/1992 | Howard et al. | |
| 5,207,865 A * | 5/1993 | Satoh | 216/18 |
| 5,261,153 A * | 11/1993 | Lucas | 29/830 |
| 5,428,506 A * | 6/1995 | Brown et al. | 361/794 |
| 5,521,576 A * | 5/1996 | Collins | 338/307 |
| 5,689,428 A * | 11/1997 | Sauerbrey et al. | 702/60 |
| 5,852,397 A * | 12/1998 | Chan et al. | 338/22 R |
| 5,912,809 A * | 6/1999 | Steigerwald et al. | 361/780 |
| 6,068,782 A | 5/2000 | Brandt et al. | |
| 6,130,597 A * | 10/2000 | Toth et al. | 338/22 R |
| 6,429,533 B1 * | 8/2002 | Li et al. | 257/783 |
| 6,898,846 B2 * | 5/2005 | Liu et al. | 29/832 |
| 2002/0155677 A1 * | 10/2002 | Baker et al. | 438/396 |
| 2003/0079910 A1 * | 5/2003 | Kosowsky | 174/260 |
| 2005/0017344 A1 * | 1/2005 | Utsunomiya | 257/700 |
| 2005/0173796 A1 * | 8/2005 | Pflughaupt et al. | 257/737 |

* cited by examiner

Primary Examiner — Telly Green
(74) Attorney, Agent, or Firm — Myers Bigel Sibley & Sajovec, P.A.

(57) ABSTRACT

Disclosed are low profile discrete electronic component structures that are suitable for placement and use in a vertical interconnection mode either within an electronic interconnection substrate, between interconnection substrate and electronic component or within an IC package.

16 Claims, 5 Drawing Sheets

Prior Art

Figure 5

LOW PROFILE DISCRETE ELECTRONIC COMPONENTS AND APPLICATIONS OF SAME

CROSS-REFERENCE TO RELATED APPLICATIONS

This application is a Divisional Application, and incorporates by reference in its entirety, U.S. patent application Ser. No. 10/857,830 Filed Jun. 1, 2004, which claims priority from U.S. Provisional Application No. 60/474,442 filed May 30, 2003 and entitled "LOW PROFILE DISCRETE ELECTRONIC COMPONENTS FOR USE IN VERTICAL INTERCONNECTION APPLICATIONS." U.S. Provisional Application No. 60/474,442 is hereby incorporated by reference in its entirety.

FIELD OF THE INVENTION

The present invention relates to the field of discrete electronic components and component-interconnect structures.

BACKGROUND

Discrete electronic passive components are generally simple but important devices that serve to control, moderate or terminate the flow of electronic signals to and from other circuit elements (e.g. integrated circuits) in electronic interconnection systems. These devices commonly serve the most basic electronic functions.

Discrete passive electronic components such as capacitors, resistors and inductors are commonly attached to the surface of a circuit board and can take up substantial area thus limiting the space available for active components such as integrated circuits. While such devices have been significantly reduced in size over time to meet the demands of the electronics industry for products having more function in an ever smaller physical space, other problems remain. For example, the current generation of such passive devices, referred to as 0201, have dimensions of only 0.020"×0.010" (0.5 mm×0.025 mm) and these current generation of miniscule devices have proven difficult to reliably assemble to the PCB. Prospective future generation of such discrete devices are expected to be smaller still. The reasons such discrete devices are difficult to assemble are varied and are related to such matters component pick up, component placement accuracy, loss of components during assembly and shorting of devices during the soldering assembly process.

Removal of passive components from the PCB surface and integrating them into a multilayer board also offers opportunity to avoid the aforementioned difficulties and moreover allows for further miniaturization and increased system performance and reduced system noise and noise sensitivity due to shortened interconnection paths. Certain discrete component devices such as decoupling or bypass capacitors and termination resistors are well suited, especially at the higher frequencies projected for next generation electronics. Thus, there has been an increase in interest in embedding and integrating passive devices into the PCB.

Embedded and integral passive technologies have historical roots in the earliest hybrid printed circuit technologies. Embedded passive techniques that allow for the creation of passive functions from specially prepared inner layer cores for multilayer circuits have been described in the past. For example, U.S. Pat. No. 3,808,576 describes a core material having conductive and resistive layers that can be separately processed into circuits and resistors on an inner layer. In another example, U.S. Pat. No. 4,387,137 describes the manufacture of a capacitor core material that can be used to pattern capacitors on the inner layers of multilayer circuits. In each of the aforementioned cases, an entire layer of specialty material is prepared and used to create discrete areas of passive function, thus the bulk of the specially prepared material and the expense associated with it is wasted.

In yet another example of prior art, U.S. Pat. No. 5,079,069 describes a structure wherein "borrowing capacitors" are actually part of a capacitive layer pair or capacitor laminate which is part of the inner structure of the multilayer PCB, with each capacitor "borrows" capacitance from other portions of the capacitor laminate. This method is also referred to as distributed capacitance. Again while there are certain advantages to this method, it retains the disadvantage of having to employ two entire metal layers of the interconnection substrate to create the material.

In still another example, U.S. Pat. No. 6,068,782 prescribes a different method for fabricating individual, embedded capacitors for multilayer printed circuit boards. The method allows for the construction of individual, embedded capacitors anywhere inside or on the top surface of a laminated multilayer board by means of a patternable insulator which is patterned to define both the thickness and the area of a capacitor dielectric and thus provides design flexibility.

Figure 1:
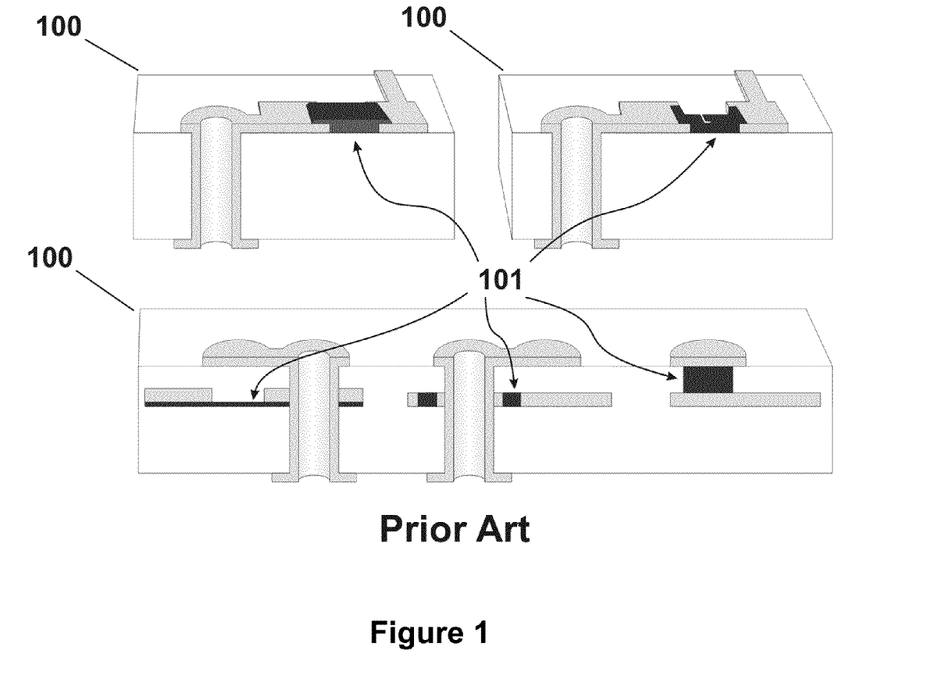
FIG. 1 illustrates prior art for comparison purposes.

FIG. 1 provides examples of prior art, wherein interconnections substrates, 100, have resistive materials, 101, applied between conductive ends of a continuous conductor path either on outer or inner surfaces of the interconnection substrate.

While all of the methods described may meet the general objectives of removing discrete devices from the surface and reducing component count, they also tend to make creation of precise values and testing more difficult. Moreover, many of the current approaches to embedding passive function devices suffer from potential process-related manufacturing value deviation and value drift problems both in use temperature swings and over time. Thus there is need for alternative methods and structures to improve upon both current technology and proposed alternative methods

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

In the following description and in the accompanying drawings, specific terminology and drawing symbols are set forth to provide a thorough understanding of the present invention. In some instances, the terminology and symbols may imply specific details that are not required to practice the invention. One skilled in the relevant art will recognize that the present invention can be practiced without one or more of these specific details. In other instances, well-known circuits, devices, structures or operations are not shown or are not described in detail to avoid obscuring aspects of the invention.

Novel approaches to manufacturing and assembling discrete electronic components are herein disclosed. Physically, the invention is a low profile (i.e. less that 500 µm and preferably less than 100 µm) discrete component which is specifically designed to have a vertical oriented connection structure (i.e. orthogonally oriented) relative to the normally planar form of the interconnection substrate on to which it is assembled and interconnected. The invention contrasts with the traditional approach to discrete component design and manufacture where components are designed to be assembled and interconnected horizontally (i.e. coplanar or parallel) with the interconnection substrate. While discrete components have been fabricated into standard interconnection substrates by, for example, placing them into holes in the PCB to allow the user to make circuit path connection from side to side by way of the component, such practice requires special care to assure that the device does become dislodged and not fall out. In contrast, the present invention does not seek to make connection from a first exposed surface of the interconnection substrate to a second exposed surface of an interconnection substrate. Rather the devices are designed to set upon a surface making interconnection from a first side of the low profile component to a surface contact on a interconnection substrate or internal layer thereof and then in a subsequent step make interconnection in an orthogonal manner to a second metal layer on the surface of or within the interconnection substrate. Interconnection substrate is hereby defined as any printed circuit, IC module, IC package, connector or socket.

The invention can be readily adapted and applied to devices having commonly employed passive functions such as resistance, capacitance and inductance. In addition, the invention can be adapted and applied to the manufacture of individual diodes. So also can the invention be adapted and applied to circuit protection fuses including self resetting fuses. Moreover, combinations of the various functions can also be created in this manner to provide more complex functions in a low profile device that can be joined and interconnected to an interconnection substrate as defined herein. For example, it allows for the creation of ESD control circuits either within the interconnection substrate, IC package, interposer device, connector or socket, which serves to interconnect two or more substrates, components or combinations of the two.

In application, discrete devices are constructed and used in the spirit of the invention by positioning them either on the surface of an interconnection structure where they might be placed on component termination lands and thus interposed between component and the interconnection substrate. The discrete devices of the invention may also be placed within the body of an interconnection structure or element but still in the circuit path. For example the low profile discrete devices can be placed and interconnected within a PCB, an IC package, a connector or a socket or be place on the surface of and between interconnected components, structures or devices, such as between an IC chip package and an interconnection substrate. In the latter example, the low profile discrete device serves as a vertical I/O connection to another circuit element or component. In such an embodiment of the invention the device may be placed on one or more terminals of an IC package or directly under a land or pad that is used for interconnecting a second component or interconnection substrate, thus further conserving space.

In one exemplary method of manufacturing the invention, the device is placed onto an interconnection substrate and a first surface (e.g. the bottom) of the device is connected to a terminal on the interconnection substrate by means of a conductive joining material such as conductive adhesive, non-conductive adhesive or solder. Such devices can then be over coated with an insulating material so that it becomes embedded in, and by appearance, one with the interconnection substrate. Accessing the upper contact is accomplished by a suitable means such as laser ablation, mechanical abrasion or cutting, chemical milling, plasma etching or photolithographic development. Such process steps expose the contact surface and make if accessible to plating. It is also possible that the low profile devices could be stacked one atop the next to create additive values or alternatively mixed or multiple serial functions. Depending on the materials of construction and approach to manufacture employed, the devices produced could be resistors, capacitors, inductors, electrostatic discharge (ESD) protection devices, diodes, fuses or other two surface terminal devices. Moreover, it is possible that certain combinations of the various aforementioned functions can be combined internally within the low profile discrete structure to enable the creation of a low profile, multiple function device having one or more terminals on one side and one or more terminals on the second or opposite side.

An advantage of the invention is that it enables the devices to be manufactured en masse in sheet form. This allows the devices to be made at low cost. This also allows the devices to be fabricated and separated into discrete devices having more precise values than those produced using more traditional methods. This approach facilitates such devices being made to a desired value or in the case of a device having more than one circuit path, multiple values. This approach also allows for the creation of layered differing functions within the package, (e.g. a resistor topped by a capacitor or a resistor topped by a diode, etc.) This also facilitates easier handling and characterization of the devices than can be achieved using either traditionally produced products or current generation embedded discrete devices.

The discrete device structures described are suitable for use in IC packages, substrates and connectors but are not so limited. In addition, while the devices disclosed herein describe discrete devices having a single electrical contact terminals on a first side and a single electrical contact terminal on a second side for reasons of simplicity, it is possible for the devices to have more than one electrical contact terminal on the first side and more than one terminal on the second side and thus low profile devices with multiple terminals are considered to be within the scope of the invention.

Figure 2:
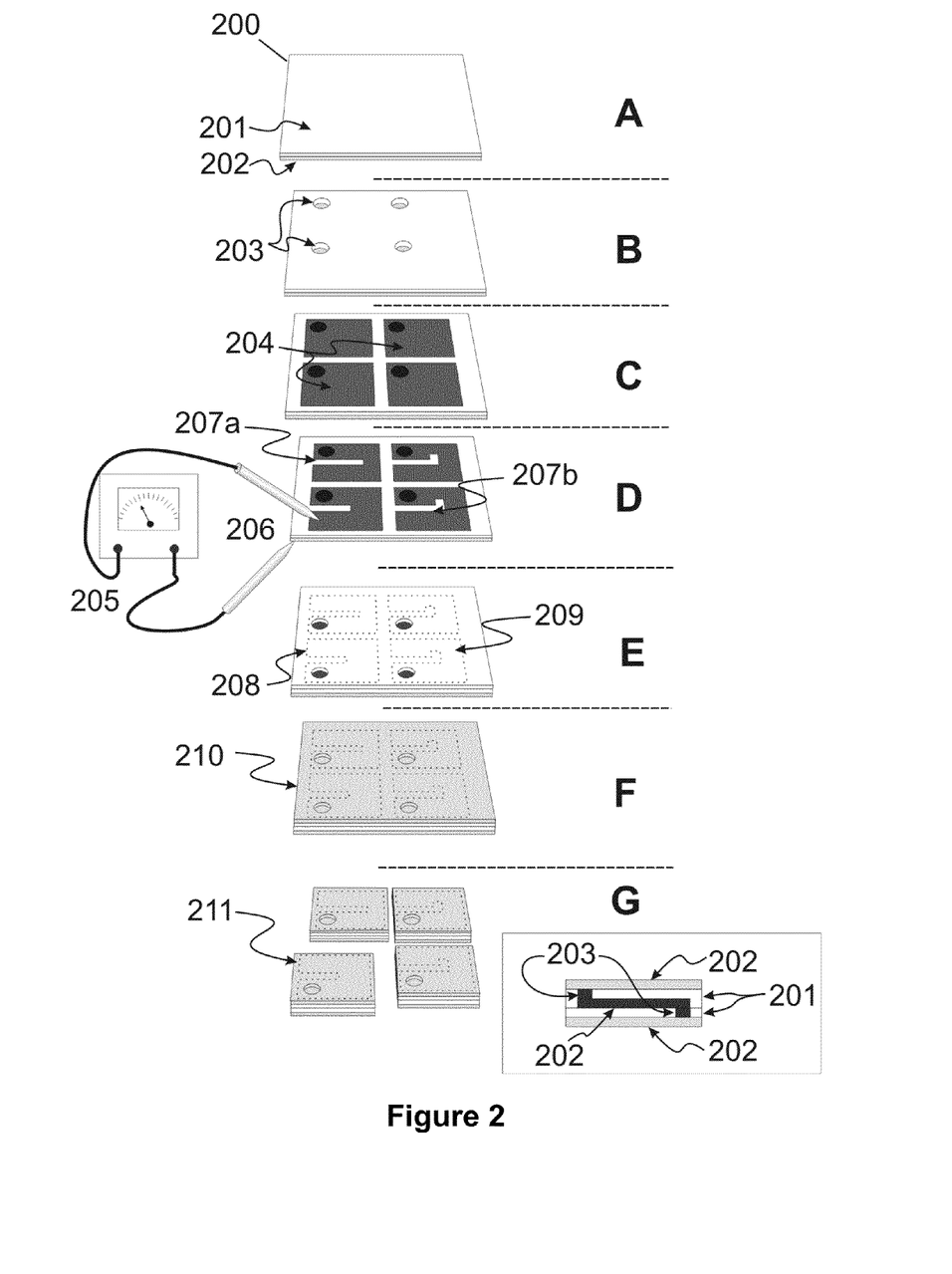
FIG. 2 provides a perspective view of the manufacturing process for one embodiment of the invention.

FIG. 2 illustrates a method for manufacturing an embodiment of the invention that could serve as a discrete resistor element. The figure illustrates how multiple devices having varying values can be manufactured on a single sheet.

In this example of an embodiment of a process, A of FIG. 2 begins the process with a base sheet, 200, consisting of an insulating material, 201, and a conductive material or metal foil, 202, however, the metal foil may not be required in other embodiments.

In B of FIG. 2, holes or openings. 203, are made in the insulating material using a suitable process (e.g laser, chemical milling etc.) to expose the conductive surface or metal foil.

In C of FIG. 2, a resistor material of a common resistance value or having varied resistance values, 204, is deposited by a suitable means for the chosen resistor material, (e.g stenciling, sputtering, etc.) It may be patterned (as illustrated) or bulk coated.

In D of FIG. 2, patterned resistor materials may be trimmed using a resistance measurement device, 205, having probes, 206, contacted to the terminal locations or surfaces. Trimming can be by performed by a suitable method, such as a laser or mechanical abrasion, to create a specific value 207a or one or more alternative values 207b if desired on a single sheet of material.

In E of FIG. 2, of this process embodiment, an insulating film, 209, is applied by a suitable method (e.g., screen printing or lamination) and holes or apertures are maintained or created by a suitable means leaving exposed the resistor material near the terminal that establishes the resistor value.

In F of FIG. 2, the surface of the insulator is metallized, 210, by a suitable method (e.g., sputtering, electroless plating, stenciling, etc.) covering the surface and holes and coating the exposed resistor material.

In G of FIG. 2, the planar discrete devices having first and second surface contacts, 211, are separated from the panel on which they were fabricated by a suitable means such as sawing, cutting or punching. The inset shows a cross section of the finished component.

While this example shows an exemplary process embodiment for the manufacture of a resistor device, other devices having different functions such as coil inductors, parallel plate capacitors wherein a thin dielectric material of high dielectric constant is interposed between the electrical contact surfaces, electrostatic discharge (ESD) protection structures wherein a voltage switchable dielectric is interposed between the electrical contacts and specially prepared diodes can be manufactured using modifications of or alternatives to the aforementioned materials.

In operation, ESD devices protect electronic circuits by switching or shunting over voltage conditions to ground. Such structures are most concerned with human body models for protection and voltages from 20 volts to 2 kilovolts. Lower switching voltages are preferred. The switching time must be rapid to protect the circuits and ideally is switched to ground in less than 150 nanoseconds. In general, materials used to form the voltage switchable dielectric act as insulators at applied voltages below a given threshold voltage (referred to herein as a switching voltage), and as conductors at applied voltages above the threshold voltage. Examples of voltage switchable materials that may be used include, without limitation, air and various reported mixtures of polymers and conductive particles (e.g. SurgX and other products from SurgX Corporation, Pipersville, Pa.). Such derivatives are considered to be within the scope of the invention.

Figure 3:
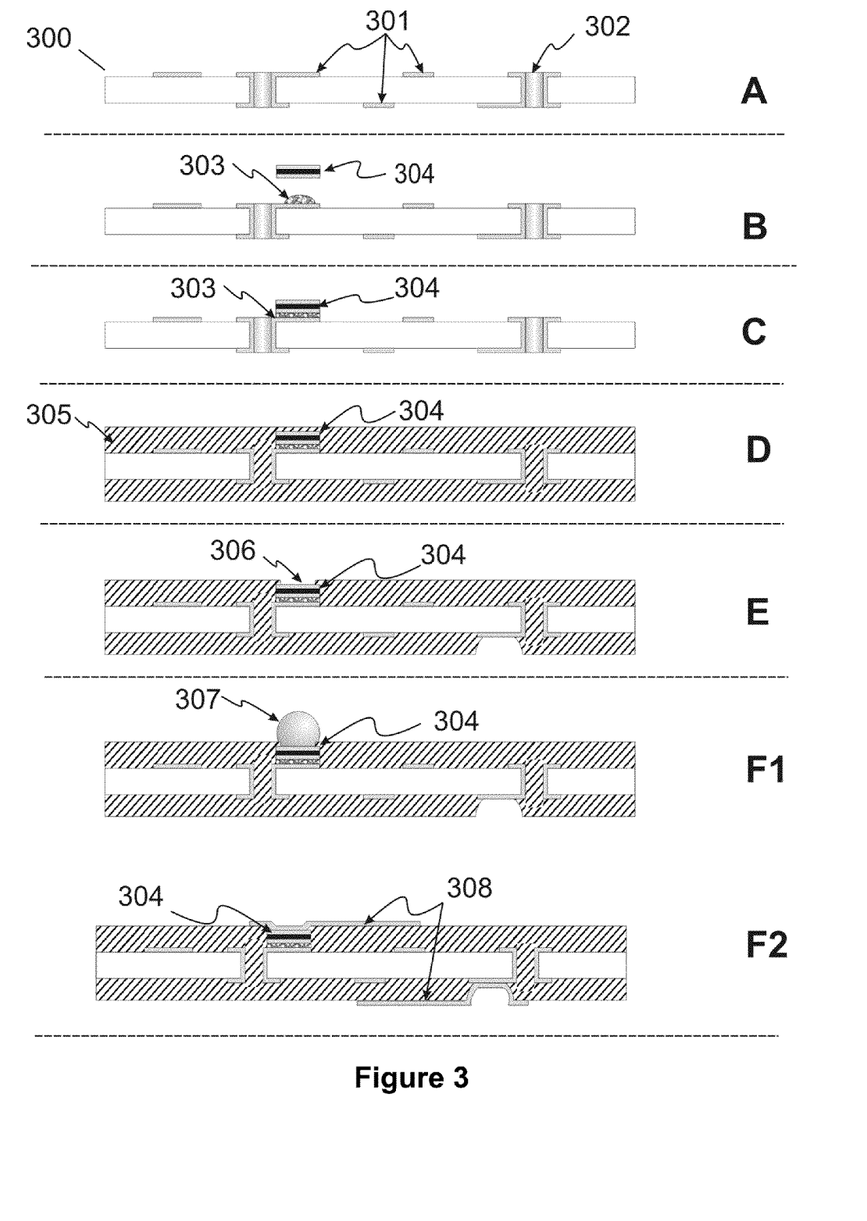
FIG. 3 provides a cross sectional partial view of on an assembly process for one embodiment of the invention for application in interconnection substrates.

FIG. 3 illustrates an embodiment of the invention wherein a low profile discrete device fabricated is fabricated or embedded into an interconnection substrate.

In A of FIG. 3, an interconnection substrate, 300, having circuit trace elements, 301, and plated through apertures, 302, is provided for processing In B of FIG. 3, a discrete device, 304, having a function is aligned to a chosen terminals on the interconnection substrate having a suitable joining material for the device (e.g., solder, conductive adhesive, non conductive adhesive, etc.).

In C of FIG. 3 the discrete device, 304, having a functions is attached to a chosen terminal on the interconnection substrate using a suitable joining material for the device. (e.g., solder, conductive adhesive, non conductive adhesive, etc.)

In D of FIG. 3, an insulating material, 305, is applied by a suitable means (e.g. lamination, coating, etc.) encapsulating the discrete device, 304.

In E of FIG. 3, an aperture, 306, is made in the insulating material to expose the conductive terminal contact surface of the embedded device, 304.

In F1 of FIG. 3, an alternative embodiment of the invention wherein the conductive terminal is made ready for subsequent direct interconnection to another electronic element by coating the terminal with a suitable material, 307, (e.g. solder).

In F2 of FIG. 3, an alternative embodiment of the invention wherein the conductive terminal is made ready for subsequent interconnection to a spatially remote electronic element by plating the conductive terminal during a next layer circuitization process with a suitable material, 308, (e.g. copper). The discrete element thus provides an inline circuit function that is substantially orthogonal (e.g. perpendicular) to the length and width dimensions of the interconnection substrate.

Figure 4:
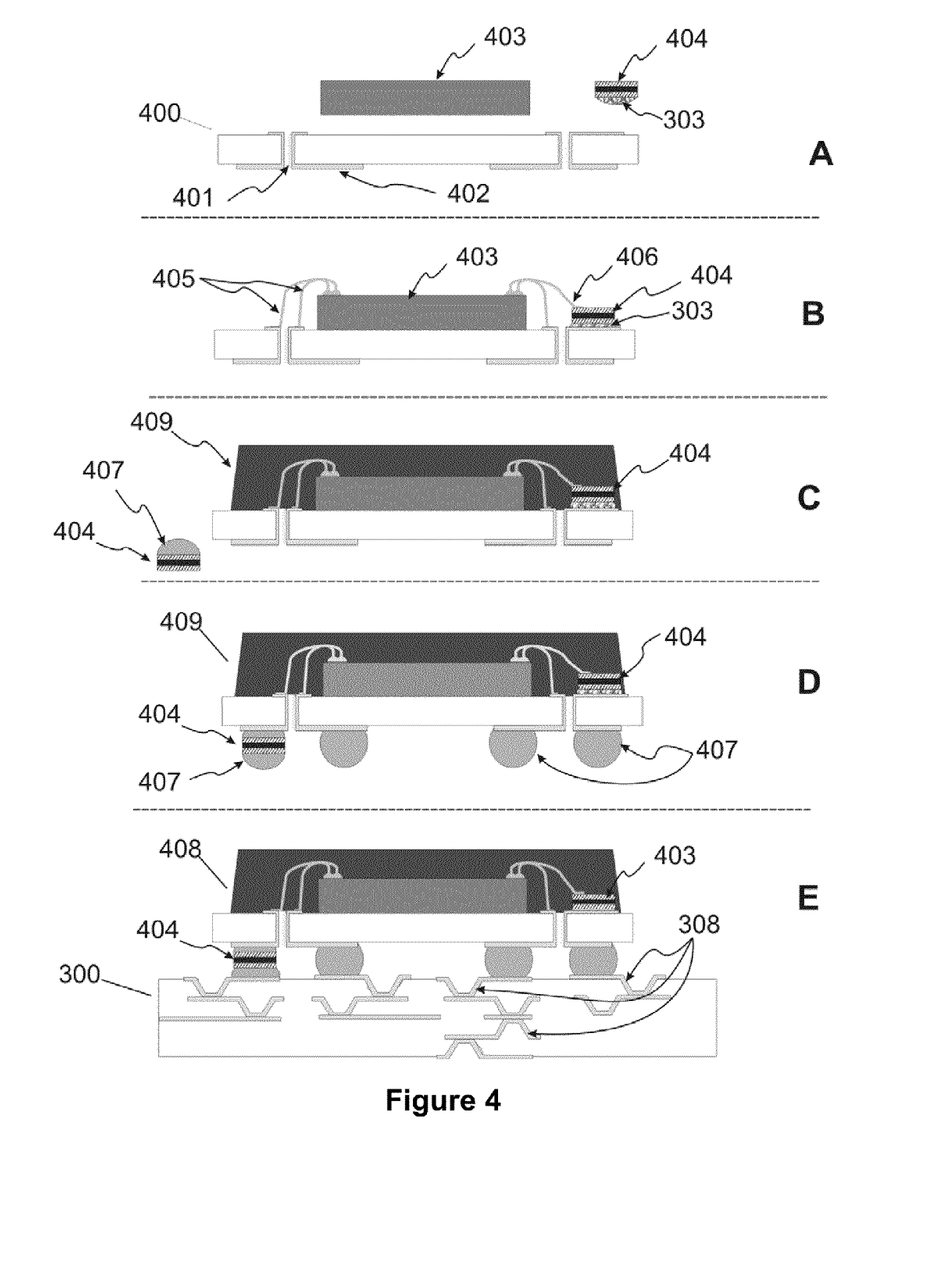
FIG. 4 provides a cross sectional partial view of one embodiment of the invention for application in Interconnection devices or modules that can be mounted on to next level interconnection substrates.

FIG. 4 illustrates an embodiment of the invention, wherein the discrete devices are made integral elements of other more complex devices such as an IC package or an electronic module.

In A of FIG. 4, an IC package or module substrate, 400, having circuit and terminal elements 402 and circuit paths passing from a first surface to a second surface made by such features as plated through holes, 401, has one or more IC devices, 403, aligned for attachment. A low profile, discrete device, 404, is positioned in a desired location. In the figure, a joining material, 303, is pre-applied to the device but it could as well be applied to the site where the device is to be attached.

In B of FIG. 4, the IC, 403, is attached to the IC package substrate or module using a suitable adhesive (not shown) and interconnected by a suitable means such as bonding wires, 405, or flip chip (not shown). In the illustration, the discrete device, 404, is interposed and connected by a suitable material, 303, between the interconnection path and the IC and the wire bond, 406, is made to an exposed surface that is properly disposed to the needs of the assembly process of the discrete device. The discrete device may contact one or more circuit paths on the substrate depending on the needs and requirements of the circuit.

In C of FIG. 4, the IC package or module is encapsulated to protect the wires and the attached discrete device(s) are encapsulated at the same time. In conjunction with or as an alternative to use of the discrete devices in the package, another embodiment has discrete devices readied for attachment to external terminal(s) of the package or module. The discrete device, 404, has a suitable joining material, 407, employed to make the connection to the terminal or terminals.

In D of FIG. 4, the completed IC package or module assembly, 408, has a suitable joining material, 407, applied to all terminals to facilitate next level assembly. The joining material can be solder or any other suitable material. In the figure, discrete devices, having the same or different electronic functions are shown both inside and out side the encapsulated region of the structure.

In E of FIG. 4, the assembly, 408, is attached to a next level interconnection substrate, 300, having circuit trace elements, 308, that transmit electronic signals between it and other selected circuit elements (not shown) of the overall assembly. The discrete device embodiments of the invention, 404, are thus integrated into the circuit design.

Figure 5:
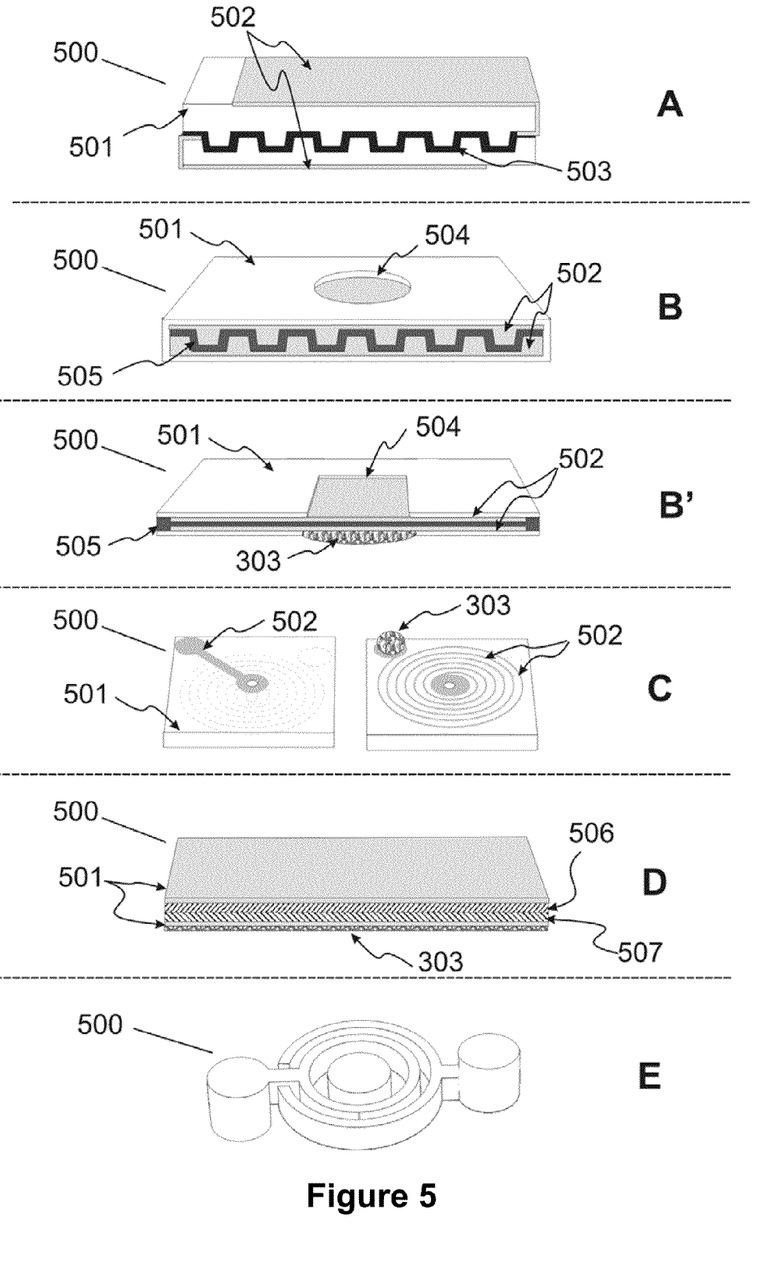
FIG. 5 provides a cross sectional partial and perspective views of various embodiments of the invention for specific electrical or electronic applications or functions.

In FIG. 5 are illustrated selected embodiments of discrete devices representative of various implementations of the invention.

In FIG. 5A is shown a perspective cut away view of an alternative embodiment of a discrete device, 500, to serve as a resistor. In the embodiment shown, an insulation material, 501, having an undulating surface on one side and a planar metal surface, 502. The metal surface wraps around the end to allow contact with the resistor material, 503. The value of the resistor is dependant on the material used, the thickness and the number and depth of the undulations.

In FIG. 5B is shown a perspective cut away view of an embodiment of a discrete device, 500, to serve as a capacitor. In the embodiment shown, an insulation material, 501, with and aperture, 504, coats flat metal conductors, 502, having a flat surfaces and an undulating surfaces which oppose and interlock. The undulating metals are bonded using an insulating material having suitable dielectric constant and thickness to allow for the creation of a capacitor of a desired value.

In FIG. 5B' is shown a perspective cut away view of an alternative embodiment of a discrete device, 500, to serve as a capacitor. In the embodiment shown, an insulation material, 501, with and aperture, 504, coats metal conductors, 502, having a flat surfaces oppose and bonded using an insulating material, 505 having suitable dielectric constant and thickness to allow for the creation of a capacitor of a desired value. The device is shown with an aperture on the second side having been provided with a suitable joining material, 303, for use in assembly in its application.

In FIG. 5C is shown first and second side perspective views of an embodiment of a discrete device, 500, to serve as an inductor. In the embodiment shown, an insulation material, 501, has metal conductors having patterns suitable for creating and inductor. In this embodiment the metal conductor is shown in a coil pattern, 502. The pattern egresses in the center of the coil from a first side to a second side. The terminal ingresses on the second side where it can be contacted. While illustrated with only one coil, multiple coils could be stacked to create a higher Q value.

In FIG. 5D is shown a perspective cut away view of an embodiment of a discrete device, 500, to serve as a diode. In the illustration, a semiconductor material, 506, (e.g., silicon) of appropriate thickness is doped or otherwise appropriately treated (e.g., using a diffusion technique) with p-type dopant on one side to a depth suitable to create a vertical P region, 508, and on the other side with n-type dopant to a depth suitable to create a vertical N region, 507, and thence a junction through the planar structure and a diode. The semiconductor or alternative core material is coated with metal or other conductive material, 501, and a joining material can be applied to one or both surfaces if it serves to facilitate subsequent assembly and joining. The low profile discrete devices can be pre embedded in a polymer to protect them (not shown) and its metal surfaces can then be accessed by a suitable method so that they can be embedded in an interconnection structure.

FIG. 5E provides a perspective view of a section of interconnection triplet for that can serve as a discrete coaxial pin and improve the signal integrity of interconnections made thereby.

Although the invention has been described with reference to specific exemplary embodiments thereof, it will be evident that various modifications and changes may be made thereto without departing from the broader spirit and scope of the invention. The specification and drawings are, accordingly, to be regarded in an illustrative rather than a restrictive sense.

What we claim is:

1. An electrostatic discharge protective device (ESD) comprising:
    a first conductive contact, on an upper external surface of the device that is exposed for direct contact with an ESD source, having an upward facing planar surface;
    a second conductive contact, on a lower external surface of the device, opposite the upper external surface, that is exposed for direct contact with the ESD source, having a downward facing planar surface substantially parallel to the upward facing planar surface;
    an insulating layer disposed between the first and second conductive contacts, the insulating layer having an opening therein; and
    a voltage switchable dielectric layer disposed within the opening and in direct physical contact with the first and second conductive contacts to provide electrostatic discharge protection by operatively switching from a relatively non-conductive state to a relatively conductive state in response to contact of the ESD source with the first or second contacts.

2. The electrostatic discharge protective device of claim 1, wherein the downward facing surface is in a different plane than the upward facing surface.

3. The electrostatic discharge protective device of claim 2, wherein at least a section of the downward facing planar surface is vertically aligned beneath a section of the upward facing planar surface, such that a line perpendicular to the upward facing planar surface passes through a first point on the upward facing planar surface and a second point on the downward facing planar surface.

4. The electrostatic discharge protective device of claim 1, wherein the voltage switchable dielectric layer comprises air.

5. The electrostatic discharge protective device of claim 1, wherein a switching voltage of the voltage switchable dielectric layer is between 2 kilovolts and 20 volts.

6. The electrostatic discharge protective device of claim 1 wherein a switching voltage of the voltage switchable dielectric layer is less than 20 volts.

7. The electrostatic discharge protective device of claim 1 wherein an activation time of the voltage switchable dielectric layer is less than 150 nanoseconds.

8. An electrical assembly comprising:
    a printed circuit board with a metal layer having a signal trace;
    an electrostatic discharge protective device comprising
    i) a first conductive contact, on an upper external surface of the printed circuit board that is exposed for direct contact with an ESD source, having a first surface conductively coupled with the signal trace,
    ii) a second conductive contact, on a lower external surface of the printed circuit board, opposite the upper external surface, that is exposed for direct contact with the ESD source, having a second surface substantially parallel to the first surface,
    iii) an insulating layer disposed between the first and second conductive contacts, the insulating layer having an opening therein, and
    iv) a voltage switchable dielectric layer disposed within the opening and in direct physical contact with the first and second conductive contacts to provide electrostatic discharge protection by operatively switching from a relatively non-conductive state to a relatively conductive state in response to contact of the ESD source with the first or second contacts.

9. The electrical assembly of claim 8, the printed circuit board further comprising first and second external surfaces, wherein the signal trace is disposed on an interior layer between the first external and second external surfaces.

10. The electrical assembly of claim 8, wherein the second surface is in a different plane than the first surface.

11. The electrical assembly of claim 10, wherein at least a section of the second surface is vertically aligned beneath a section of the first surface, such that a line perpendicular to the first surface passes through a first point one the first surface and a second point on the second surface.

12. The electrical assembly of claim 8, wherein the voltage switchable dielectric layer comprises air.

13. The electrical assembly of claim 8, wherein a switching voltage of the voltage switchable dielectric layer is between 2 kilovolts and 20 volts.

14. The electrical assembly of claim 8, wherein a switching voltage of the voltage switchable dielectric layer is less than 20 volts.

15. The electrical assembly of claim 8 wherein an activation time of the voltage switchable dielectric layer is less than 150 nanoseconds.

16. The electrical assembly of claim 9, further comprising a device package with a package terminal conductively coupled with the second conductive contact of the electrostatic discharge protective device.

* * * * *